United States Patent
Zhai et al.

(10) Patent No.: US 9,935,639 B2
(45) Date of Patent: Apr. 3, 2018

(54) FREQUENCY DIVIDER AND PHASE-LOCKED LOOP INCLUDING THE SAME

(71) Applicant: Semiconductor Manufacturing International (Shanghai) Corporation, Shanghai (CN)

(72) Inventors: Dalun Zhai, Shanghai (CN); Jun Hu, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 213 days.

(21) Appl. No.: 14/887,101

(22) Filed: Oct. 19, 2015

(65) Prior Publication Data

US 2016/0164533 A1    Jun. 9, 2016

(30) Foreign Application Priority Data

Dec. 8, 2014 (CN) .......................... 2014 1 0743029

(51) Int. Cl.
*H03K 21/00* (2006.01)
*H03K 23/00* (2006.01)
*H03L 7/183* (2006.01)
*H03K 23/42* (2006.01)
*H03K 23/66* (2006.01)
*H03K 23/40* (2006.01)
*H03K 23/54* (2006.01)

(52) U.S. Cl.
CPC ............ *H03L 7/183* (2013.01); *H03K 23/42* (2013.01); *H03K 23/665* (2013.01); *H03K 21/00* (2013.01); *H03K 23/00* (2013.01); *H03K 23/40* (2013.01); *H03K 23/54* (2013.01)

(58) Field of Classification Search
None
See application file for complete search history.

(56) References Cited

U.S. PATENT DOCUMENTS

| | | | |
|---|---|---|---|
| 5,020,082 A * | 5/1991 | Takeda | H03K 23/004 377/108 |
| 5,614,869 A | 3/1997 | Bland | |
| 5,867,068 A * | 2/1999 | Keating | H03L 7/1978 327/107 |
| 6,061,418 A * | 5/2000 | Hassoun | H03K 21/10 327/115 |

(Continued)

*Primary Examiner* — Tuan T Lam
(74) *Attorney, Agent, or Firm* — Innovation Counsel LLP

(57) ABSTRACT

A frequency divider includes a first shifter and a second shifter. The first shifter includes first to M-th clock control components connected together to form a first ring. The control components in the first shifter are controlled by an input clock signal such that signals are shifted along the first ring. An output of selected clock control components in the first shifter is provided as a carry signal of the first shifter. The second shifter includes first to N-th clock control components connected together to form a second ring. The control components in the second shifter are controlled by the carry signal of the first shifter such that the signals are shifted along the second ring. An output of selected clock control components in the second shifter is provided as a carry signal of the second shifter. M and N are integers greater than one.

17 Claims, 9 Drawing Sheets

(56) References Cited

U.S. PATENT DOCUMENTS

| | | | | |
|---|---|---|---|---|
| 6,163,182 A * | 12/2000 | Canard | ................ | H03K 23/542 327/115 |
| 6,356,123 B1 * | 3/2002 | Lee | ........................ | H03K 23/68 327/115 |
| 6,707,326 B1 * | 3/2004 | Magoon | .................... | G06F 7/68 327/115 |
| 7,113,009 B2 * | 9/2006 | Sun | ........................ | H03K 21/08 327/115 |
| 7,924,965 B2 * | 4/2011 | Tseng | ........................ | G06F 1/08 377/47 |
| 7,965,808 B2 * | 6/2011 | Marutani | ............. | H03K 23/667 377/47 |
| 2004/0201411 A1 * | 10/2004 | White | ................. | H03K 19/1737 327/407 |
| 2010/0327929 A1 * | 12/2010 | Zhang | ................. | H03K 5/1565 327/175 |
| 2011/0299651 A1 * | 12/2011 | Yang | ...................... | H03K 23/54 377/124 |
| 2012/0313674 A1 * | 12/2012 | Malmcrona | .......... | H03K 23/425 327/117 |
| 2015/0030117 A1 * | 1/2015 | Zhang | .................... | H03K 21/38 377/47 |

\* cited by examiner

FREQUENCY DIVIDER AND PHASE-LOCKED LOOP INCLUDING THE SAME

CROSS-REFERENCE TO RELATED APPLICATION

This application claims priority to Chinese Patent Application No. 201410743029.9 filed on Dec. 8, 2014, the disclosure of which is incorporated herein by reference in its entirety.

BACKGROUND

Technical Field

The present disclosure relates to a frequency divider and a phase-locked loop including the same.

Description of the Related Art

To synchronize electrical signals between different electronic components, a system clock is commonly used as a timing device to send data or signals between the different components. In particular, a phase-locked loop (PLL) is typically used to establish the system clock.

A PLL typically includes an input reference clock divider (input divider), a phase frequency detector (PFD), a charge pump (CP), a low pass filter (LPF), a voltage controlled oscillator (VCO), and a feedback clock frequency converter (feedback divider). The PLL compares an input reference clock signal (input signal) with an output frequency-divided clock signal (output signal), aligns the phases of the input and output signals, and locks the frequency ratio between the input and output signals (frequency multiple ratio).

The input signal having a particular frequency may be generated from a crystal oscillator or other means. The frequency of the output signal is determined by the PLL. In most instances, the (synthesized) output signal is much faster than the input signal. Thus, the feedback divider is usually operated at high speeds.

Frequency dividers may be classified into synchronous dividers and asynchronous dividers. Asynchronous dividers can be operated in multiple stages. Each stage runs at lower frequency, which results in lower power consumption and reduced high frequency clock loading. However, asynchronous dividers have the disadvantage of jitter/latency accumulation.

Although synchronous dividers have reduced jitter, all flip-flops in the synchronous dividers are operated at maximum frequency, which results in higher power consumption and large loading on the high frequency clock.

SUMMARY

The present disclosure addresses at least the above issues in the prior art.

According to an embodiment of the inventive concept, a frequency divider is provided. The frequency divider includes: a first shifter comprising first to M-th clock control components connected together to form a first ring, wherein the control components in the first shifter are controlled by an input clock signal such that signals are shifted along the first ring, wherein M is a first integer greater than one, and wherein an output of selected clock control components in the first shifter is provided as a carry signal of the first shifter; and a second shifter comprising first to N-th clock control components connected together to form a second ring, wherein the control components in the second shifter are controlled by the carry signal of the first shifter such that the signals are shifted along the second ring, wherein N is a second integer greater than one, and wherein an output of selected clock control components in the second shifter is provided as a carry signal of the second shifter.

In some embodiments, the frequency divider may further include a selection module configured to: receive the output of each clock control component in the first shifter and the second shifter; and, based on a division factor: provide the output of selected clock control components in the first shifter as the carry signal of the first shifter to the second shifter, and the output of selected clock control components in the second shifter as the carry signal of the second shifter.

In some embodiments, each clock control component in the first ring may include an input, an output, and a clock input configured to receive a clock signal, wherein the output of one clock control component may be connected to the input of another clock control component, and the clock input of the clock control components in the first ring may receive the input clock signal from an external source; and each clock control component in the second ring may include an input, an output, and a clock input configured to receive a clock signal, wherein the output of one clock control component may be connected to the input of another clock control component, and the clock input of the clock control components in the second ring may receive the carry signal of the first shifter.

In some embodiments, the clock control components may include one or more of a trigger, a register, and a random access memory (RAM).

In some embodiments, the selection module may include: a switch array comprising a plurality of switches for controlling the output of each clock control component in the first shifter and the second shifter, wherein the switch array may be configured to provide, based on the division factor, the output of selected clock control components in the first shifter as the carry signal of the first shifter, and the output of selected clock control components in the second shifter as the carry signal of the second shifter.

In some embodiments, the selection module may further include an AND gate having a first input, a second input, and an output, wherein the carry signal of the first shifter may be connected to the first input of the AND gate, and the carry signal of the second shifter may be connected to the second input of the AND gate, and wherein the output of the AND gate may be the output of the selection module.

In some embodiments, the frequency divider may further include a refresh module configured to provide, in response to the carry signal of the second shifter, a refresh signal to revert some or all of the clock control components to their initial states.

In some embodiments, the frequency divider may further include a refresh module configured to provide, in response to the output of the selection module, a refresh signal to revert some or all of the clock control components to their initial states.

In some embodiments, the clock control components may include D flip-flops having set/reset capability, and wherein the clock control components may be set or reset by a refresh signal.

In some embodiments, the selection module may further include a decoder configured to receive a division factor signal specifying the division factor, and output a corresponding control signal to control a switch array.

In some embodiments, the selection module may further include a register configured to provide the division factor signal to the decoder.

In some embodiments, the frequency divider may further include: a third shifter comprising first to K-th clock control components connected together to form a third ring, wherein the control components in the third shifter may be controlled by the carry signal of the second shifter such that the signals are shifted along the third ring, and wherein K may be a third integer greater than one.

In some embodiments, the frequency divider may further include: a third shifter comprising first to K-th clock control components connected together to form a third ring, wherein the control components in the third shifter may be controlled by the carry signal of the second shifter such that the signals are shifted along the third ring, wherein K may be a third integer greater than one, and wherein the selection module may be configured to receive the output of each clock control component in the third shifter, and provide, based on the division factor, the output of selected clock control components in the third shifter as the carry signal of the third shifter.

In some embodiments, each clock control component in the third ring may include an input, an output, and a clock input configured to receive a clock signal, wherein the output of one clock control component may be connected to the input of another clock control component, and the clock input of the clock control components in the third ring may receive the carry signal of the second shifter.

According to another embodiment of the inventive concept, a phase-locked loop including a frequency divider is provided. The frequency divider includes: a first shifter comprising first to M-th clock control components connected together to form a first ring, wherein the control components in the first shifter are controlled by an input clock signal such that signals are shifted along the first ring, wherein M is a first integer greater than one, and wherein an output of selected clock control components in the first shifter is provided as a carry signal of the first shifter; and a second shifter comprising first to N-th clock control components connected together to form a second ring, wherein the control components in the second shifter are controlled by the carry signal of the first shifter such that the signals are shifted along the second ring, wherein N is a second integer greater than one, and wherein an output of selected clock control components in the second shifter is provided as a carry signal of the second shifter.

According to a further embodiment of the inventive concept, a method of operating a frequency divider is provided. The frequency divider includes a first shifter comprising first to M-th clock control components connected together to form a first ring and a second shifter comprising first to N-th clock control components connected together to form a second ring, wherein M is a first integer greater than one and N is a second integer greater than one. The method includes: controlling the first shifter using an input clock signal such that signals are shifted along the first ring; providing the output of selected clock control components in the first shifter as a carry signal of the first shifter; controlling the second shifter using the carry signal of the first shifter such that the signals are shifted along the second ring; and providing the output of selected clock control components in the second shifter as a carry signal of the second shifter.

In some embodiments, the method may further include: receiving, through a selection module, the output of each clock control component in the first shifter and the second shifter; and providing, based on a division factor, the carry signal of the first shifter to the second shifter, and the carry signal of the second shifter.

In some embodiments, the frequency divider may further include a third shifter comprising first to K-th clock control components connected together to form a third ring, wherein K may be a third integer greater than one, and the method may further include: controlling the third shifter using the carry signal of the second shifter such that the signals are shifted along the third ring; and providing the output of selected clock control components in the third shifter as a carry signal of the third shifter.

In some embodiments, the frequency divider may further include a third shifter comprising first to K-th clock control components connected together to form a third ring, wherein K may be a third integer greater than one, and the method may further include: controlling the third shifter using the carry signal of the second shifter such that the signals are shifted along the third ring; and receiving, through the selection module, the output of each clock control component in the third shifter, and providing, based on the division factor, a carry signal of the third shifter.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Figure 1:
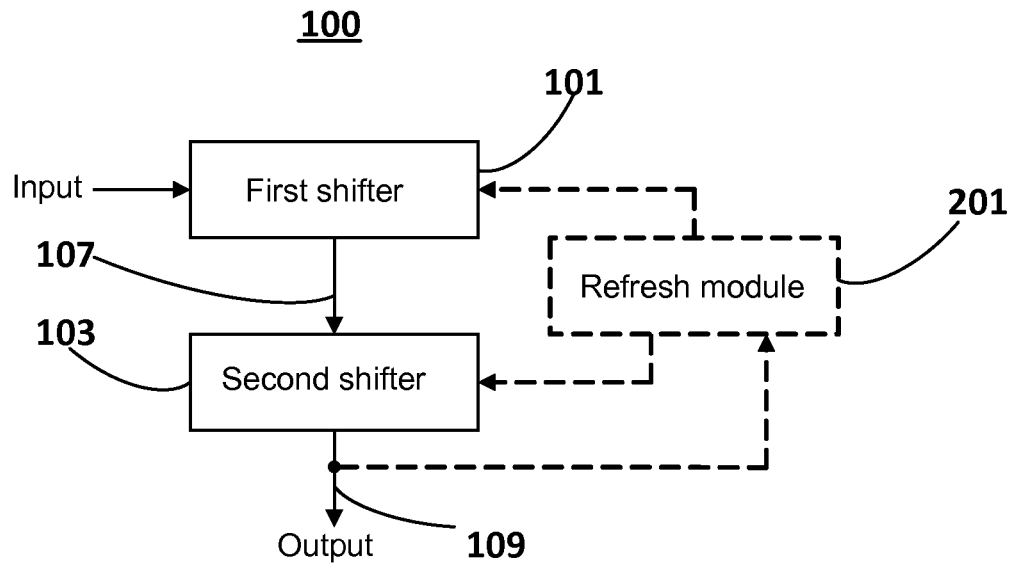
FIG. 1 is a block diagram of a frequency divider according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout. It should be noted that similar reference numerals and letters refer to similar items in the following figures, and therefore, once an item is defined in one figure or described, it is not required in the subsequent description of the drawings in further discussion.

Ordinary skill in the relevant art known techniques, methods and apparatus may not be discussed in detail, but in the application of these techniques, methods and apparatus, these techniques, methods and apparatus should be considered as part of this specification.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

FIG. 1 is a block diagram of a frequency divider 100 according to an embodiment. Referring to FIG. 1, the frequency divider 100 includes a first shifter 101 and a second shifter 103. In some embodiments, the frequency divider 100 may further include a refresh module 201. The first shifter 101 includes two or more clock control components (e.g., M number of components, whereby M is an integer greater than 1) connected together to form a first ring. The clock control components of the first shifter 101 are controlled by an input signal (e.g. a clock signal) such that signals are shifted along the first ring. The first ring may be referred to as a first bit, or a least significant bit (LSB). The output of selected clock control components in the first shifter 101 may be provided as a carry signal 107 of the first shifter 101, as described in further detail below.

The second shifter 103 includes two or more clock control components (e.g., N number of components, whereby N is an integer greater than 1) connected together to form a second ring. The clock control components of the second shifter 103 are controlled by the carry signal 107 of the first shifter 101 such that the signals are shifted along the second ring. The second ring may be referred to as a second bit, or a most significant bit (MSB). Similarly, the output of selected clock control components in the second shifter 103 may be provided as a carry signal 109 of the second shifter 103. In the embodiment of FIG. 1, the carry signal 109 constitutes the output of the frequency divider 100. However, the inventive concept is not limited thereto. In some other embodiments, as described later in the specification, other signals may constitute the output of the frequency divider.

The refresh module 201 may be configured to provide a refresh signal to revert some or all of the clock control components to their initial states. For example, in the embodiment of FIG. 1, in response to the carry signal 109 from the second shifter 103, the refresh module 201 may provide a refresh signal to revert some or all of the clock control components in the first shifter 101 and the second shifter 103 to their initial states.

One of ordinary skill in the art will understand that the clock control components may include (but is not limited to) one or more of the following: flip-flops (e.g., D flip-flops, RS flip-flops, etc.), a register, a random access memory (RAM), etc. In some embodiments, the shifter may include (or be termed) a shift register.

Those skilled in the art will also appreciate that embodiments of the inventive concept may include two or more shifters. For example, in some embodiments, the frequency divider 100 may further include a third shifter. Similar to the first shifter and the second shifter, the third shifter may include a first to K-th clock control components connected together to form a third ring, whereby K is an integer greater than 1. The clock control components of the third shifter are controlled by the carry signal of the second shifter such that the signals are shifted along the third ring. In the third ring, each clock control component includes an input, an output, and a clock input configured to receive a clock signal. The output of one clock control component is connected to the input of another clock control component. The clock input of each clock control component in the third shifter receives the carry signal of the second shifter.

Figure 2:
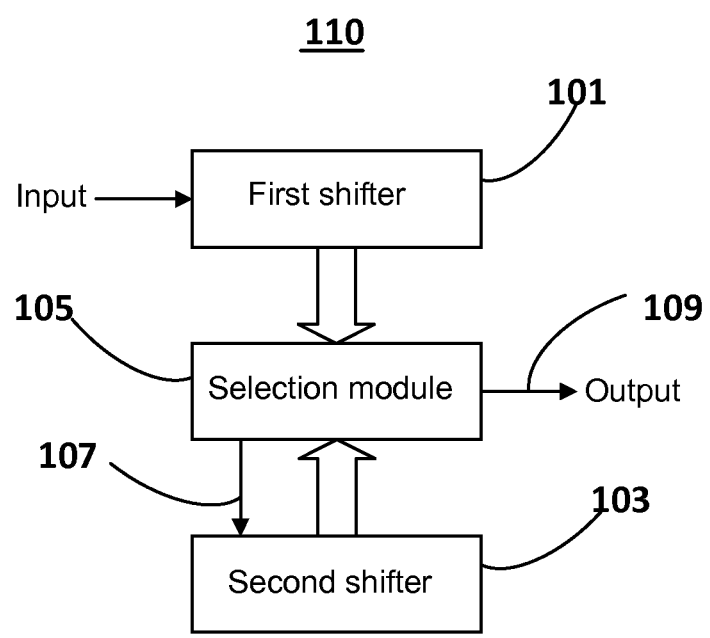
FIG. 2 is a block diagram of a frequency divider according to another embodiment.

FIG. 2 is a block diagram of a frequency divider 110 according to another embodiment. Referring to FIG. 2, the frequency divider 110 includes a first shifter 101, a second shifter 103, and a selection module 105. Similar to the embodiment of FIG. 1, the first shifter 101 in FIG. 2 includes two or more clock control components (e.g., M number of components, whereby M is an integer greater than 1) connected together to form a first ring. The clock control components of the first shifter 101 are controlled by an input signal (e.g. a clock signal) such that signals are shifted along the first ring.

The selection module 105 is configured to receive the output of each clock control component in every shifter (e.g., the first shifter 101 and the second shifter 103). Based on a division factor, the selection module 105 provides a signal to drive or control the clock of shifters (if any) in subsequent stages. For example, the selection module 105 receives the output of each clock control component in the first shifter 101, and provides a signal based on a division factor to drive or control the clock of a shifter (e.g., the second shifter 103) in a subsequent stage, whereby the signal corresponds to the carry signal 107 of the first shifter 101. As described above, the carry signal 107 may be used to control the clock of the second shifter 103. In the embodiment of FIG. 2, the selection module 105 operates using a division factor, whereby the output of selected clock control components in the first shifter constitutes the carry signal of the first shifter and is supplied to the second shifter.

The division factor may be pre-stored in the selection module 105. For example, the division factor may be pre-stored in a memory device (such as registers, read-only memory (ROM), electrically erasable programmable read-only memory (EEPROM), etc.) in the selection module 105. In some embodiments, the division factor may be received from an external source. In some embodiments, the division factor may be programmable, so that the frequency divider is also programmable, and this can facilitate adjustment of the frequency division ratios between the input reference clock and the output clock.

The second shifter 103 includes two or more clock control components (e.g., N number of components, whereby N is an integer greater than 1) connected together to form a second ring. The clock control components of the second shifter 103 are controlled by the carry signal 107 of the first shifter 101 such that the signals are shifted along the second ring. The second ring may be referred to as a second bit, or a most significant bit (MSB).

The selection module 105 also receives the output of each clock control component in the second shifter 103. Based on the division factor, the selection module 105 provides the output of selected clock control components in the second shifter 103 as the carry signal 109 of the second shifter 103. As shown in FIG. 2, the carry signal 109 is the output of the selection module 105. In some embodiments, the carry signal 109 or the output of the selection module 105 may be the output of the frequency divider 110. In some embodiments, the carry signal 109 of the second shifter 103 may be used to drive or control the clock of shifters in subsequent stages, as described below.

Figure 3:
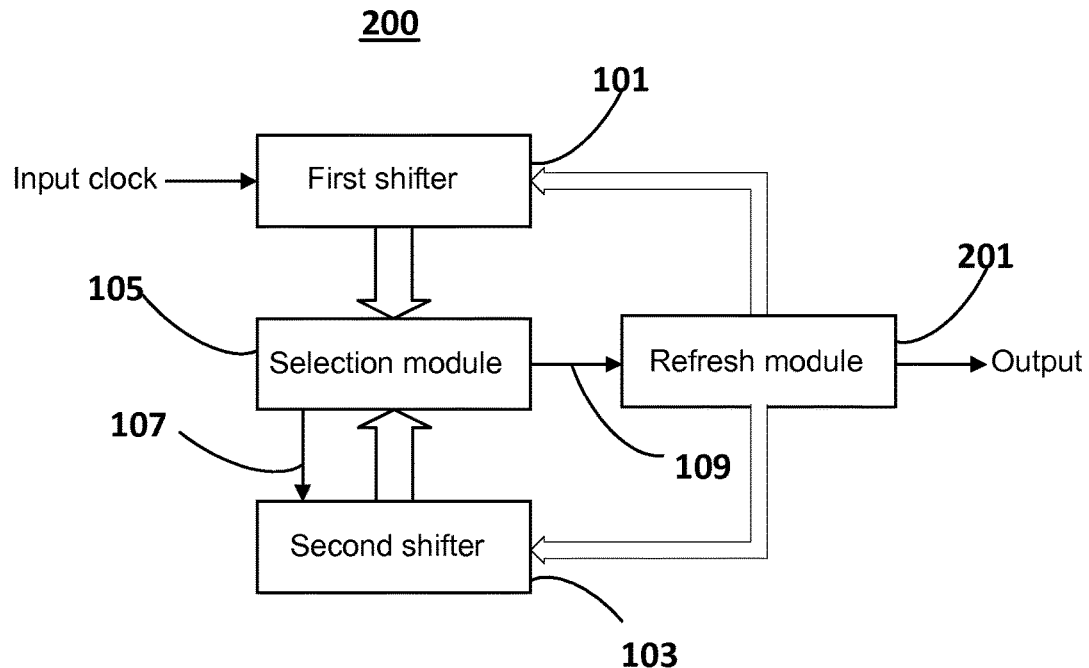
FIG. 3 is a block diagram of a frequency divider according to yet another embodiment.

FIG. 3 is a block diagram of a frequency divider 200 according to yet another embodiment. The frequency divider 200 of FIG. 3 is similar to the frequency divider 110 of FIG. 2, except the frequency divider 200 further includes a refresh module 201. In response to the output of the selection module 105 (i.e., the carry signal 109 of the second shifter 103), the refresh module 201 provides a refresh signal to the first shifter 101 and the second shifter 103, so as to revert selected clock control components in the first shifter 101 and the second shifter 103 to their initial states. In some embodiments, some or all of the clock control components can be reset or set to their initial states.

Figure 4:
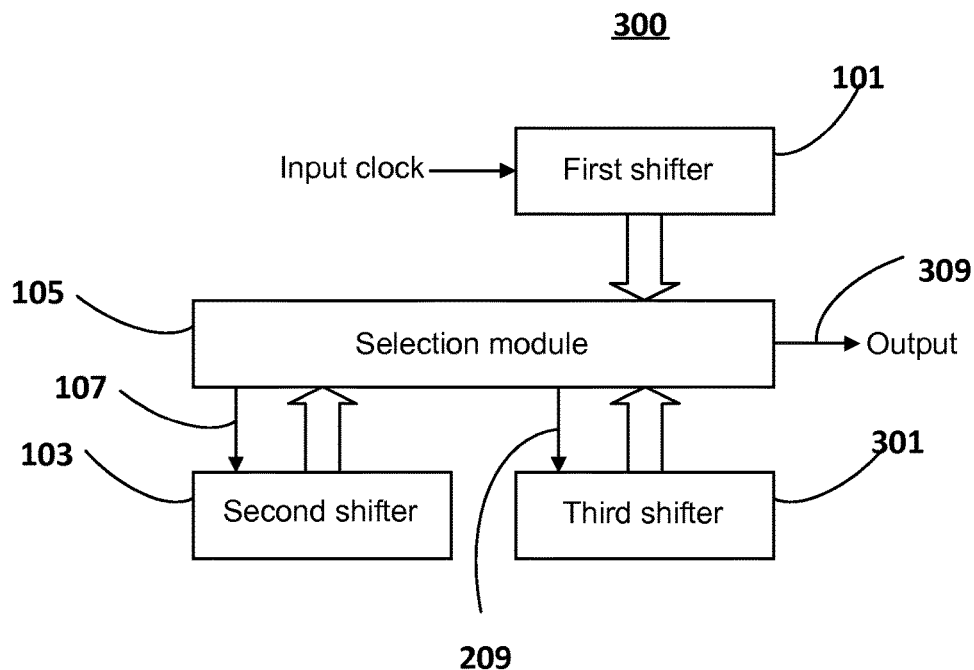
FIG. 4 is a block diagram of a frequency divider according to a further embodiment.

FIG. 4 is a block diagram of a frequency divider 300 according to a further embodiment. The frequency divider 300 of FIG. 4 is similar to the frequency divider 110 of FIG. 2, except the frequency divider 300 further includes a third shifter 301. The third shifter 301 includes two or more clock control components (e.g., K number of components, whereby K is an integer greater than 1) connected together to form a third ring. The clock control components of the third shifter 301 are controlled by a carry signal 209 of the second shifter 103 such that the signals are shifted along the third ring. The third ring may be referred to as a third bit. In the embodiment of FIG. 4, the third bit (not the second bit) constitutes a most significant bit (MSB).

The selection module 105 receives the output of each clock control component in the third shifter 301. Based on the division factor, the selection module 105 provides the output of selected clock control components in the third shifter 301 as a carry signal 309 of the third shifter 301. As shown in FIG. 4, the carry signal 309 is the output of the selection module 105. In some embodiments, the carry signal 309 or the output of the selection module 105 may be the output of the frequency divider 300. In some embodiments, the carry signal 309 of the third shifter 301 may be used to drive or control the clock of shifters in subsequent stages.

Accordingly, embodiments of the inventive concept may include a plurality of shifters in different stages. A shifter in a stage may be termed as a bit. The carry signal of a shifter of a particular stage (a bit) may be used to control the clock of one or more shifters in one or more subsequent stages (other bit(s)). The output of the last stage (last bit) can be the output of the selection module. In some embodiments, the output of the last stage (last bit) can also be the output of the frequency divider.

Figure 5:
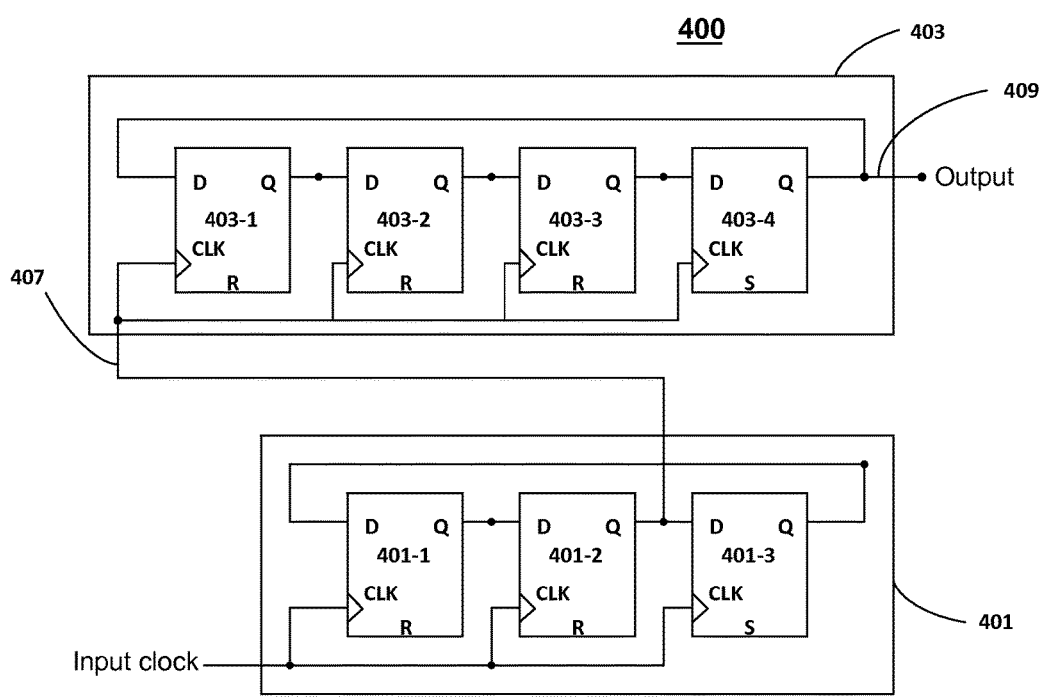
FIG. 5 is a schematic diagram of a frequency divider according to an embodiment.

FIG. 5 is a schematic diagram of a frequency divider 400 according to an embodiment. Specifically, FIG. 5 illustrates the embodiment of FIG. 1 in greater detail, with the frequency divider 400 corresponding to the frequency divider 100. Referring to FIG. 5, the frequency divider 400 includes a first shifter 401 and a second shifter 403. In the embodiment of FIG. 5, clock control components include D flip-flops.

The first shifter 401 includes first to M-th clock control components (whereby M is an integer greater than 1) connected together to form a first ring. In the embodiment of FIG. 4, M equals to three, and therefore the first shifter 401 includes clock control components 401-1, 401-2, and 401-3. In the first ring, each of the clock control components 401-1, 401-2, and 401-3 includes an input D, an output Q, and a clock input CLK configured to receive a clock signal. The output of one clock control component is connected to the input of another clock control component. The clock input CLK of the clock control components in the first shifter 401 receives the input clock signal. The clock control components (D flip-flops in the present embodiment) 401-1 through 401-3 are controlled by an input signal (e.g. a clock signal) such that signals are shifted along the first ring.

In the embodiment of FIG. 5, the output of the second flip-flop 401-2 of the first shifter 401 is provided as a carry signal 407 of the first shifter 401, and supplied to the second shifter 403. However, it should be noted that the above arrangement is merely exemplary and that the inventive concept is not limited thereto. For example, in other embodiments, the output of the third flip-flop 401-3 of the first shifter 401 may be provided as the carry signal of the first shifter 401, and supplied to the second shifter 103.

The second shifter 403 includes first to N-th clock control components (whereby N is an integer greater than 1) connected together to form a second ring. In the embodiment of FIG. 4, N equals to four, and therefore the second shifter 403 includes clock control components 403-1, 403-2, 403-3, and 403-4. In the second ring, each of the clock control components 403-1, 403-2, 403-3, and 403-4 includes an input D, an output Q, and a clock input CLK configured to receive a clock signal. The output of one clock control component is connected to the input of another clock control component. The input clock of each of the clock control components 403-1 through 403-4 receives the carry signal 407 of the first shifter 401. The clock control components (D flip-flops in the present embodiment) 403-1 through 403-4 are controlled by the carry signal 407 of the first shifter 401 such that the signals are shifted along the second ring.

In the embodiment of FIG. 5, a carry signal 409 of the second shifter 403 may constitute the output of the frequency divider 400.

It should be noted that in the inventive concept, the clock control components within each shifter (ring) are synchronized, whereas the different shifters (rings) are asynchronous. Accordingly, the issues in the prior art (such as high power consumption, jitter/latency accumulation, and large loading on the high frequency clock) can be reduced or eliminated using embodiments of the inventive concept. In other words, the exemplary frequency divider may be described as a hybrid synchronous-asynchronous frequency divider.

It should also be noted that since the clock control components in each shifter are connected to form a ring within each shifter, therefore M, N, and K are integers greater than or equal to two.

Figure 6:
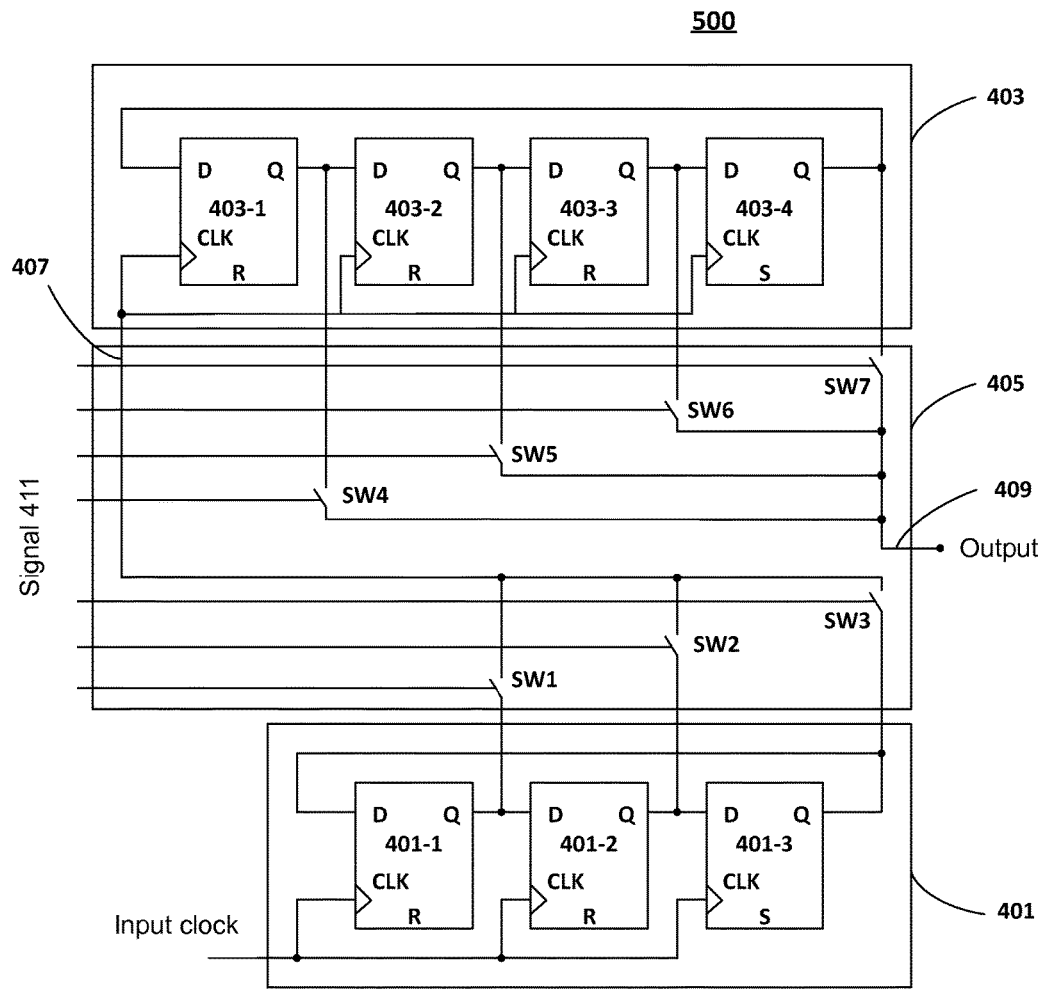
FIG. 6 is a schematic diagram of a frequency divider according to another embodiment.

FIG. 6 is a schematic diagram of a frequency divider 500 according to an embodiment. Specifically, FIG. 6 illustrates the embodiment of FIG. 2 in greater detail, with the frequency divider 500 corresponding to the frequency divider 110. Referring to FIG. 6, the frequency divider 500 includes a first shifter 401, a second shifter 403, and a selection module 405. In the embodiment of FIG. 6, clock control components include D flip-flops.

The first shifter 401 includes first to M-th clock control components (whereby M is an integer greater than 1) connected together to form a first ring. In the embodiment of FIG. 6, M equals to three, and therefore the first shifter 401 includes clock control components 401-1, 401-2, and 401-3. In the first ring, each of the clock control components 401-1, 401-2, and 401-3 includes an input D, an output Q, and a clock input CLK configured to receive a clock signal. The output of one clock control component is connected to the input of another clock control component. The clock input CLK of the clock control components in the first shifter 401 receives the input clock signal. The clock control components (D flip-flops in the present embodiment) 401-1 through 401-3 are controlled by an input signal (e.g., a clock signal) such that signals are shifted along the first ring.

The selection module 405 receives the output of each clock control component in the first shifter 401. Based on a division factor, the selection module 405 provides a carry signal 407 of the first shifter 401 to the clock input CLK of each clock control component in the second shifter 403.

The second shifter 403 includes a first to N-th control components (whereby N is an integer greater than 1) connected together to form a second ring. In the embodiment of FIG. 6, N equals to four, and therefore the second shifter 403 includes clock control components 403-1, 403-2, 403-3, and 403-4. In the second ring, each of the clock control components 403-1, 403-2, 403-3, and 403-4 includes an input D, an output Q, and a clock input CLK configured to receive a clock signal. The output of one clock control component is connected to the input of another clock control component. The input clock of each of the clock control components 403-1 through 403-4 receives the carry signal 407 of the first shifter 401. The clock control components (D flip-flops in the present embodiment) 403-1 through 403-4 are controlled by the carry signal 407 of the first shifter 401 such that the signals are shifted along the second ring.

The selection module 405 also receives the output of each clock control component in the second shifter 403. Based on the division factor, the selection module 405 provides a carry signal 409 of the second shifter 403 as the output of the selection module 405.

As shown in FIG. 6, the selection module 405 further includes a switch array. The switch array includes switches SW1 through SW7 for the output of each clock control component in the first shifter 401 and the second shifter 403. One end of the switches SW1 through SW7 is respectively connected to the output Q of the clock control components 401-1 through 401-3 and 403-1 through 403-4. Another end of the switches SW1 through SW3 is connected to a first line for transmitting the carry signal 407 of the first shifter 401. Another end of the switches SW4 through SW7 is connected to a second line for transmitting the carry signal 409 of the second shifter 403. The on/off operation of the switches SW1 through SW7 is controlled by a signal 411 corresponding to the division factor.

Based on the division factor, the switch array may transfer the output of selected clock control components of the first shifter 401 as the carry signal 407 of the first shifter 401, and transfer the output of selected clock control components of the second shifter 403 as the carry signal 409 of the second shifter 403. As an example, when the signal 411 opens the switches SW1 and SW2 (OFF) and closes the switch SW3 (ON), the output of the clock control component 401-3 is provided as the carry signal 407 of the first shifter 401 (or first ring, or first bit). When the switches SW4 through SW6 are open (OFF) and the switch SW7 is closed (ON), the output of the clock control component 403-4 is provided as the carry signal 409 of the second shifter 403 (or second ring, or second bit). In the above embodiment, the division factor may correspond to 3×4=12, such that the frequency of the output clock is 1/12 the frequency of the input clock. The division factor may be selected anywhere from 1 through M×N (for example, in the embodiment of FIG. 4, M×N=3×4). However, it should be understood that the division factor need to be limited to the above selection. Those skilled in the art can easily modify the selection module to select different division factors or range of division factors.

In the present embodiment, the carry signal 409 of the second shifter 403 is provided as the output of the selection module 405. In some embodiments, the carry signal 409 or the output of the selection module 405 may be the output of the frequency divider 500.

It should be noted that in the inventive concept, the clock control components within each shifter (ring) are synchronized, whereas the different shifters (rings) are asynchronous. Accordingly, the issues in the prior art (such as high power consumption, jitter/latency accumulation, and large loading on the high frequency clock) can be reduced or eliminated. In other words, the exemplary frequency divider may be described as a hybrid synchronous-asynchronous frequency divider.

It should be further noted that the selection module need not be limited to a switch array. Those skilled in the art will understand that the selection module may include a combination of different logic components for switching purposes.

Figure 7:
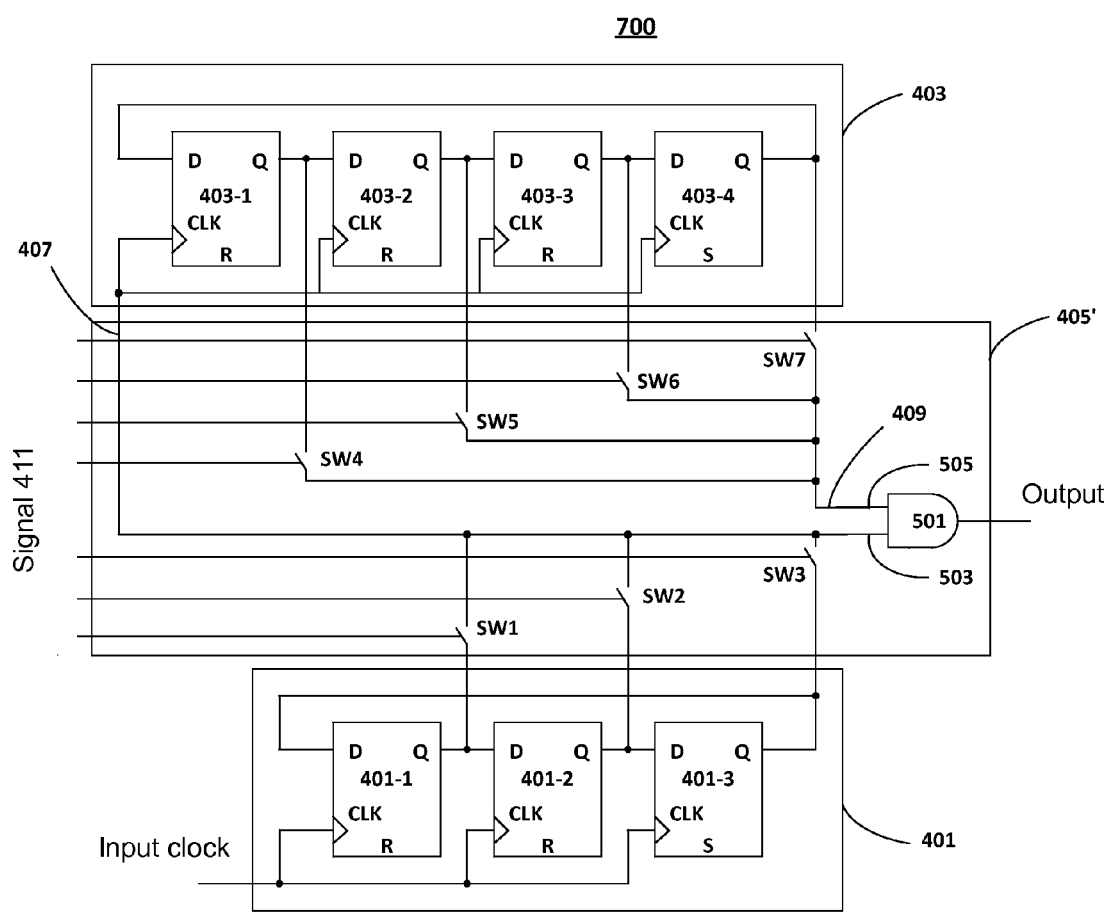
FIG. 7 is a schematic diagram of a frequency divider according to yet another embodiment.

FIG. 7 is a schematic diagram of a frequency divider 700 according to yet another embodiment. The frequency divider 700 of FIG. 7 is similar to the frequency divider 500 of FIG. 6 except for a difference in the selection module. A selection module 405' of FIG. 7 is similar to the selection module 405 of FIG. 6, except the selection module 405' further includes an AND gate 501. In the embodiment of FIG. 7, the carry signal 407 of the first shifter 401 is supplied to a first input 503 of the AND gate 501, and the carry signal 409 of the second shifter 403 is supplied to a second input 505 of the AND gate 501. The output of the AND gate 501 is provided as the output of the selection module 405'. In some embodiments, the output of the AND gate 501 constitutes the output of the frequency divider 700.

Compared to the embodiment of FIG. 6, the embodiment of FIG. 7 can further reduce a phase difference between the output of the first shifter 401 and the output of the second shifter 403.

Figure 8:
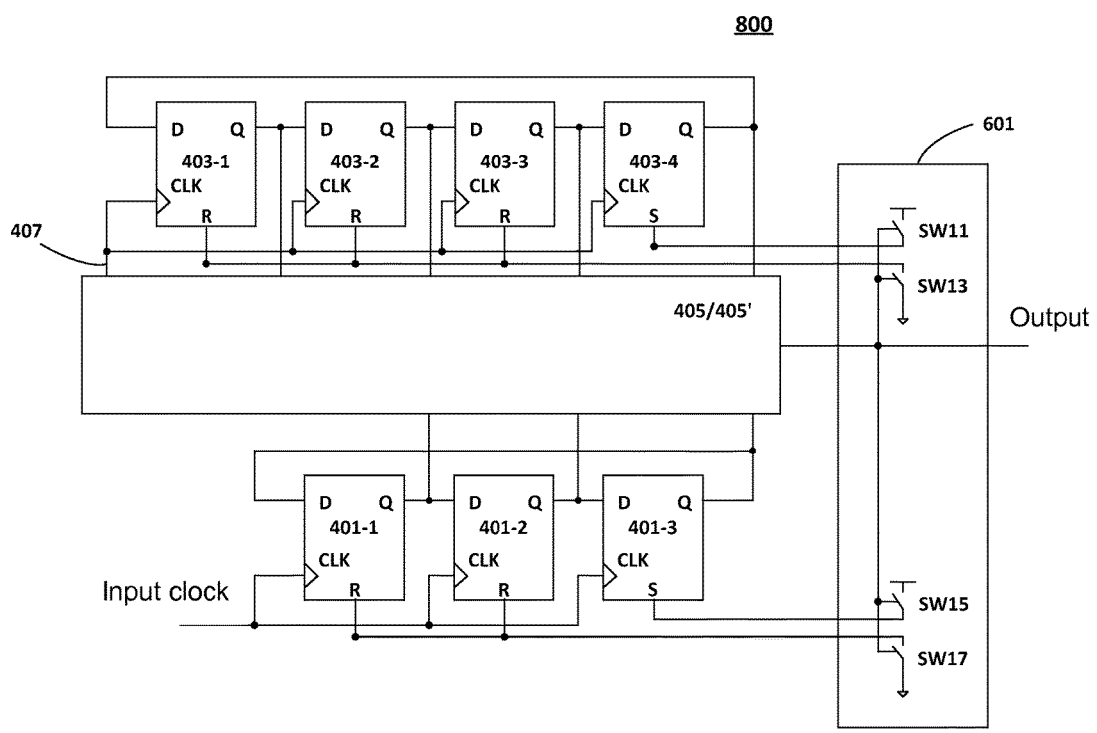
FIG. 8 is a schematic diagram of a frequency divider according to a further embodiment.

FIG. 8 is a schematic diagram of a frequency divider 800 according to a further embodiment. The frequency divider 800 of FIG. 8 is similar to the frequency divider 500 of FIG. 6 and the frequency divider 700 of FIG. 7, except the frequency divider 800 further includes a refresh module 601. In response to the output of the selection module 405/405' (e.g., the carry signal 409 in FIG. 6, or the output signal of the AND gate 501 in FIG. 7), the refresh module 601 provides a refresh signal to revert selected clock control components to their initial states. For example, as shown in FIG. 8, by using D flip-flops having set/reset capability, the refresh module 601 can reset or set (selected) clock control components. Referring to FIG. 8, the refresh module 601 includes pull-up switches SW11 and SW15 and pull-down switches SW13 and SW17 providing a high logic level and a low logic level to the set/reset (S/R) ends of the D flip-flops, respectively. However, the inventive concept is not limited thereto. Depending on the type of clock control components used, the refresh mechanism may be provided in various forms. For example, in some embodiments, the output of the AND gate 501 may be provided to the reset terminal of a D flip-flop, so as to reset the D flip-flop. In other embodiments, opposite logic levels/states may be used to reset the D flip-flop.

Figure 9:
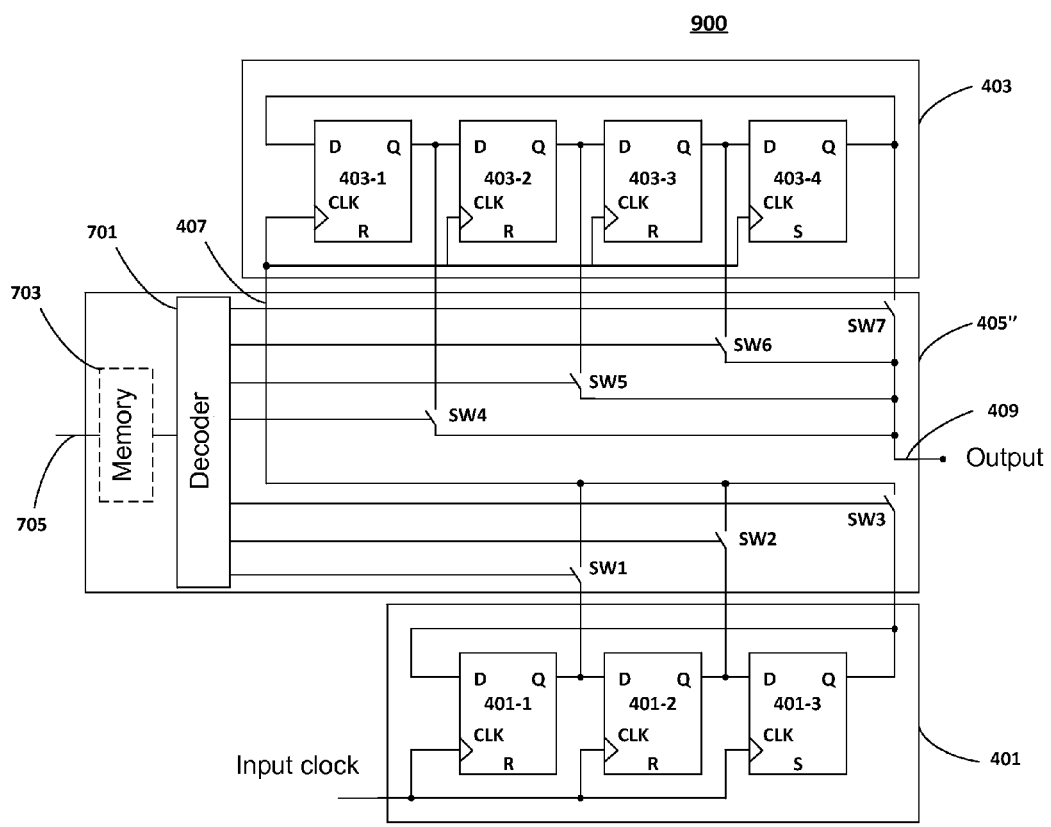
FIG. 9 is a schematic diagram of frequency divider according to another further embodiment.

FIG. 9 is a schematic diagram of frequency divider 900 according to another further embodiment. The frequency divider 900 of FIG. 9 is similar to the frequency divider 800 of FIG. 8, except a selection module 405" of the frequency divider 900 further includes a decoder 701. The decoder 701 is configured to generate the signal 411 corresponding to the division factor. The control signal 411 may be generated based on a signal received through an input 705 from an external source, and/or by decoding the division factor stored in a memory (e.g., register) 703. As previously described, in some embodiments, the division factor may be programmable.

Figure 10:
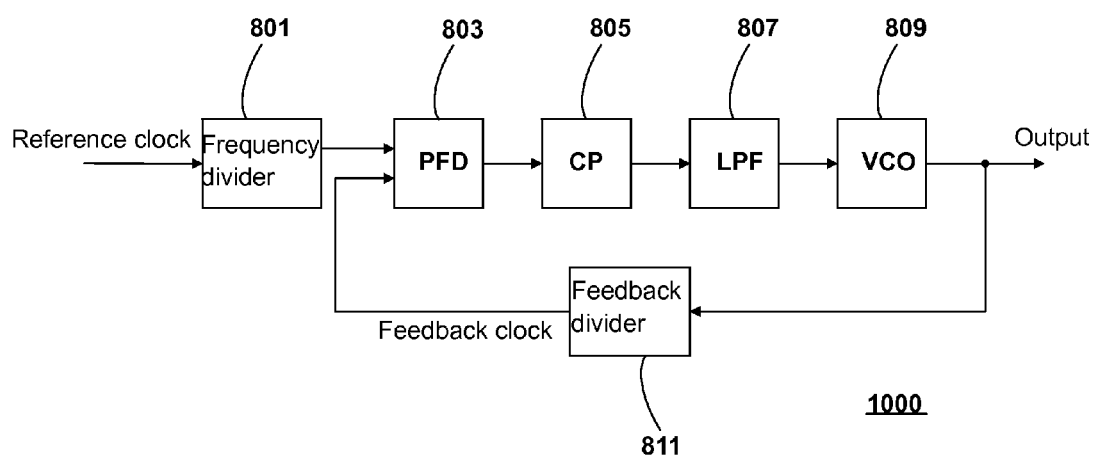
FIG. 10 is a schematic diagram of a phase-locked loop including a frequency divider according to an embodiment.

FIG. 10 is a schematic diagram of a phase-locked loop 1000 including a frequency divider according to an embodiment. The phase-locked loop 1000 includes an input reference clock divider (frequency divider) 801, a phase frequency detector (PFD) 803, a charge pump (CP) 805, a low pass filter (LPF) 807, a voltage controlled oscillator (VCO) 809, and a feedback clock divider (feedback divider) 811. The PLL compares the input reference clock with the frequency-divided feedback signal (feedback clock), aligns the phases of the reference clock and the feedback clock, and fixes the frequency multiple, so as to obtain a stable phase-locked output clock. In some cases, the reference clock, the feedback clock, and the output clock may be respectively referred to as the reference frequency, the feedback frequency, and the output frequency. The frequency divider 801 may include any one or combinations of the embodiments previously describe in FIGS. 1 through 8. To avoid obscuring the inventive concept, a detailed description of the other components in the PLL has been omitted, since those other components are known to those skilled in the art.

It should be noted that although the exemplary frequency divider is particularly well-suited for use in a phase-locked loop, the inventive concept is not limited thereto, and that the exemplary frequency divider could be used in any semiconductor device.

Figure 11:
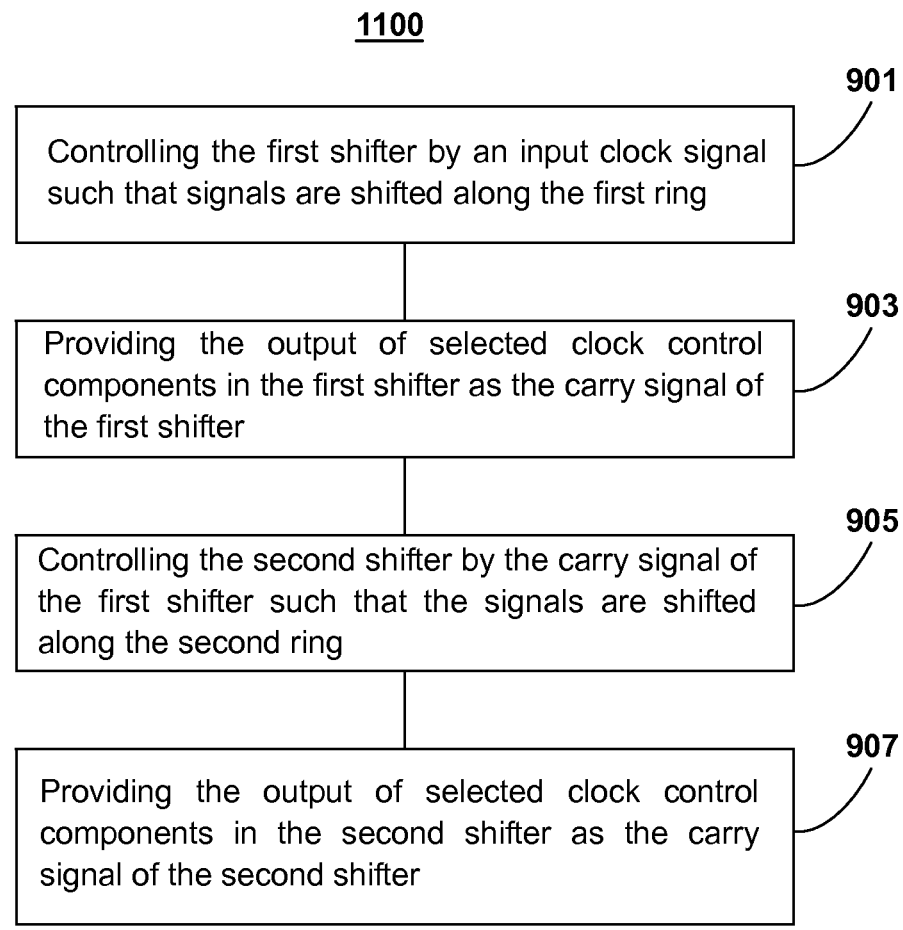
FIG. 11 is a flowchart of an exemplary method for operating a frequency divider according to an embodiment.

FIG. 11 is a flowchart of an exemplary method 1100 for operating a frequency divider according to an embodiment. The frequency divider includes a first shifter comprising first to M-th clock control components connected together to form a first ring, a second shifter comprising first to N-th clock control components connected together to form a second ring, and a selection module.

In Step 901, the first shifter is controlled by an input clock signal such that signals are shifted along the first ring. In Step 903, the output of selected clock control components in the first shifter is provided as the carry signal of the first shifter. In Step 905, the second shifter is controlled by the carry signal of the first shifter such that the signals are shifted along the second ring. In Step 907, the output of selected clock control components in the second shifter is provided as the carry signal of the second shifter. In some embodiments, the method 1100 may include further steps. For example, the selection module may receive the output of each clock control component in the first shifter and the second shifter, and provide, based on a division factor, the carry signal of the first shifter and the carry signal of the second shifter.

In some embodiments, the frequency divider further includes a third shifter comprising first to K-th clock control components connected together to form a third ring. In those embodiments, the method 1100 may further include the following step. For example, the third shifter is controlled by the carry signal of the second shifter such that the signals are shifted along the third ring. The output of selected clock control components in the third shifter is provided as the carry signal of the third shifter. The selection module may receive the output of each clock control component in the third shifter, and provide, based on the division factor, the carry signal of the third shifter.

It should be understood that the step numbering in FIG. 11 is merely to distinguish the different steps, and that the steps need not be carried out in any particular order.

Embodiments of a frequency divider, a phase-locked loop including the frequency divider, and a method of operating the frequency divider have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:
1. A frequency divider comprising:
   a first shifter comprising first to M-th clock control components connected together to form a first ring, wherein the control components in the first shifter are controlled by an input clock signal such that signals are shifted along the first ring, wherein M is a first integer greater than one, and wherein an output of selected clock control components in the first shifter is provided as a carry signal of the first shifter;

a second shifter comprising first to N-th clock control components connected together to form a second ring, wherein the control components in the second shifter are controlled by the carry signal of the first shifter such that the signals are shifted along the second ring, wherein N is a second integer greater than one, and wherein an output of selected clock control components in the second shifter is provided as a carry signal of the second shifter; and a selection module configured to:

receive the output of each clock control component in the first shifter and the second shifter; and, based on a division factor: provide the output of selected clock control components in the first shifter as the carry signal of the first shifter to the second shifter, and the output of selected clock control components in the second shifter as the carry signal of the second shifter, wherein the selection module comprises an AND gate having a first input, a second input, and an output, wherein the carry signal of the first shifter is connected to the first input of the AND gate, and the carry signal of the second shifter is connected to the second input of the AND gate, and wherein the output of the AND gate is the output of the selection module.

2. The frequency divider according to claim 1, wherein:

each clock control component in the first ring includes an input, an output, and a clock input configured to receive a clock signal, wherein the output of one clock control component is connected to the input of another clock control component, and the clock input of the clock control components in the first ring receives the input clock signal from an external source; and each clock control component in the second ring includes an input, an output, and a clock input configured to receive a clock signal, wherein the output of one clock control component is connected to the input of another clock control component, and the clock input of the clock control components in the second ring receives the carry signal of the first shifter.

3. The frequency divider according to claim 1, wherein the clock control components include one or more of a trigger, a register, and a random access memory (RAM).

4. The frequency divider according to claim 1, wherein the selection module further comprises:

a switch array comprising a plurality of switches for controlling the output of each clock control component in the first shifter and the second shifter, wherein the switch array is configured to provide, based on the division factor, the output of selected clock control components in the first shifter as the carry signal of the first shifter, and the output of selected clock control components in the second shifter as the carry signal of the second shifter.

5. The frequency divider according to claim 1, further comprising a refresh module configured to provide, in response to the carry signal of the second shifter, a refresh signal to revert some or all of the clock control components to their initial states.

6. The frequency divider according to claim 1, further comprising a refresh module configured to provide, in response to the output of the selection module, a refresh signal to revert some or all of the clock control components to their initial states.

7. The frequency divider according to claim 1, wherein the clock control components include D flip-flops having set/reset capability, and wherein the clock control components are set or reset by a refresh signal.

8. The frequency divider according to claim 1, wherein the selection module further comprises a decoder configured to receive a division factor signal specifying the division factor, and output a corresponding control signal to control a switch array.

9. The frequency divider according to claim 8, wherein the selection module further comprises a register configured to provide the division factor signal to the decoder.

10. The frequency divider according to claim 1, further comprising:

a third shifter comprising first to K-th clock control components connected together to form a third ring, wherein the control components in the third shifter are controlled by the carry signal of the second shifter such that the signals are shifted along the third ring, and wherein K is a third integer greater than one.

11. The frequency divider according to claim 1, further comprising:

a third shifter comprising first to K-th clock control components connected together to form a third ring, wherein the control components in the third shifter are controlled by the carry signal of the second shifter such that the signals are shifted along the third ring, wherein K is a third integer greater than one, and wherein the selection module is configured to receive the output of each clock control component in the third shifter, and provide, based on the division factor, the output of selected clock control components in the third shifter as the carry signal of the third shifter.

12. The frequency divider according to claim 10, wherein:

each clock control component in the third ring includes an input, an output, and a clock input configured to receive a clock signal, wherein the output of one clock control component is connected to the input of another clock control component, and the clock input of the clock control components in the third ring receives the carry signal of the second shifter.

13. A phase-locked loop including a frequency divider, wherein the frequency divider comprises:

a first shifter comprising first to M-th clock control components connected together to form a first ring, wherein the control components in the first shifter are controlled by an input clock signal such that signals are shifted along the first ring, wherein M is a first integer greater than one, and wherein an output of selected clock control components in the first shifter is provided as a carry signal of the first shifter;

a second shifter comprising first to N-th clock control components connected together to form a second ring, wherein the control components in the second shifter are controlled by the carry signal of the first shifter such that the signals are shifted along the second ring, wherein N is a second integer greater than one, and wherein an output of selected clock control components in the second shifter is provided as a carry signal of the second shifter; and a selection module configured to:

receive the output of each clock control component in the first shifter and the second shifter; and, based on a division factor: provide the output of selected clock control components in the first shifter as the carry signal of the first shifter to the second shifter, and the output of selected clock control components in the second shifter as the carry signal of the second shifter, wherein the selection module comprises an AND gate having a first input, a second input, and an output, wherein the carry signal of the first shifter is connected to the first input of the AND gate, and the carry signal of the second shifter is connected to the second input of the AND gate, and wherein the output of the AND gate is the output of the selection module.

14. A method of operating a frequency divider, wherein the frequency divider comprises a first shifter comprising first to M-th clock control components connected together to form a first ring, a second shifter comprising first to N-th clock control components connected together to form a second ring, wherein M is a first integer greater than one and N is a second integer greater than one, and a selection module comprising an AND gate having a first input, a second input, and an output, the method comprising:
- controlling the first shifter using an input clock signal such that signals are shifted along the first ring;
- providing the output of selected clock control components in the first shifter as a carry signal of the first shifter;
- controlling the second shifter using the carry signal of the first shifter such that the signals are shifted along the second ring;
- providing the output of selected clock control components in the second shifter as a carry signal of the second shifter;
- providing the carry signal of the first shifter to the first input of the AND gate; and
- providing the carry signal of the second shifter to the second input of the AND gate.

15. The method according to claim 14, further comprising:
- receiving, through the selection module, the output of each clock control component in the first shifter and the second shifter; and
- providing, based on a division factor, the carry signal of the first shifter to the second shifter, and the carry signal of the second shifter.

16. The method according to claim 14, wherein the frequency divider further comprises a third shifter comprising first to K-th clock control components connected together to form a third ring, wherein K is a third integer greater than one, the method further comprising:
- controlling the third shifter using the carry signal of the second shifter such that the signals are shifted along the third ring; and
- providing the output of selected clock control components in the third shifter as a carry signal of the third shifter.

17. The method according to claim 15, wherein the frequency divider further comprises a third shifter comprising first to K-th clock control components connected together to form a third ring, wherein K is a third integer greater than one, the method further comprising:
- controlling the third shifter using the carry signal of the second shifter such that the signals are shifted along the third ring; and
- receiving, through the selection module, the output of each clock control component in the third shifter, and providing, based on the division factor, a carry signal of the third shifter.

* * * * *